(12) United States Patent
Sumida et al.

(10) Patent No.: US 6,506,060 B2
(45) Date of Patent: *Jan. 14, 2003

(54) ELECTRICAL JUNCTION BOX

(75) Inventors: Tatsuya Sumida, Yokkaichi (JP); Hisaki Mayumi, Yokkaichi (JP); Nobuchika Kobayashi, Yokkaichi (JP); Koji Kasai, Yokkaichi (JP); Yuuji Saka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 12 days.

This patent is subject to a terminal disclaimer.

(21) Appl. No.: 09/833,595

(22) Filed: Apr. 13, 2001

(65) Prior Publication Data

US 2001/0049211 A1 Dec. 6, 2001

(30) Foreign Application Priority Data

| Apr. 13, 2000 | (JP) | 2000-112691 |
| Apr. 13, 2000 | (JP) | 2000-112702 |
| Nov. 6, 2000 | (JP) | 2000-337957 |
| Mar. 22, 2001 | (JP) | 2001-082231 |

(51) Int. Cl.[7] ............................. H01R 12/00
(52) U.S. Cl. ................. 439/76.2; 439/949; 439/74
(58) Field of Search ................. 439/76.2, 65, 74, 439/949

(56) References Cited

U.S. PATENT DOCUMENTS

| 5,179,503 A | | 1/1993 | Fouts et al. ............. 361/393 |
| 5,581,130 A | * | 12/1996 | Boucheron ............. 439/76.2 |
| 5,902,138 A | * | 5/1999 | Murakami ............. 439/76.2 |
| 5,928,004 A | | 7/1999 | Sumida et al. |
| 6,238,221 B1 | * | 5/2001 | Ikeda et al. ............. 439/76.2 |
| 6,402,530 B1 | * | 6/2002 | Saito et al. ............. 439/76.2 |

FOREIGN PATENT DOCUMENTS

| EP | 0 965 493 A2 | 12/1999 |
| EP | 0 985 585 A2 | 3/2000 |
| JP | 01 212641 | 8/1989 |
| JP | 06 165345 | 6/1994 |
| JP | 08 047144 | 2/1996 |
| JP | 11-16448 | 6/1999 |
| JP | 11-164451 | 6/1999 |
| JP | 2000-92660 | 3/2001 |

* cited by examiner

*Primary Examiner*—P. Austin Bradley
*Assistant Examiner*—Briggette R. Hammond
(74) *Attorney, Agent, or Firm*—Oliff & Berridge, PLC

(57) ABSTRACT

An electrical junction box for a vehicle provides electrical connection to electrical connectors, fuses and relays. Upper and lower case parts of a casing contain a base circuit, a fuse circuit and a relay circuit. The base circuit has first bus bars and insulation layers stacked together. The first bus bars connect to electrical connectors in use. The fuse circuit has a substrate which is discrete from the base circuit, and second bus bars providing connection to fuses in use. The relay circuit has a substrate, which is discrete from said base circuit, and third bus bars providing connection to relays in use. The second bus bars and the third bus bars are joined to the first bus bars by welding. A compact construction which is easily modified is obtained.

14 Claims, 15 Drawing Sheets

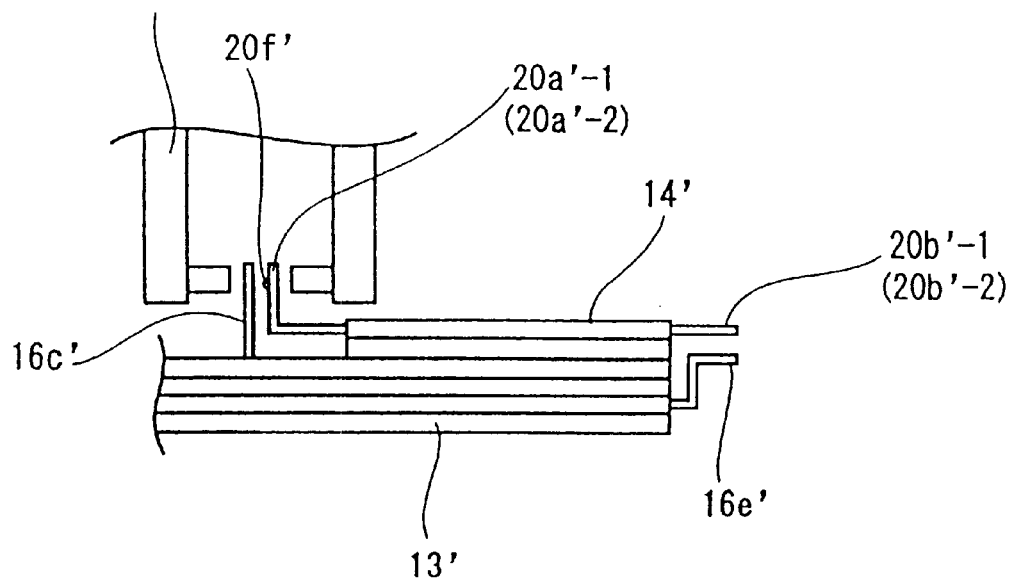
FIG. 17
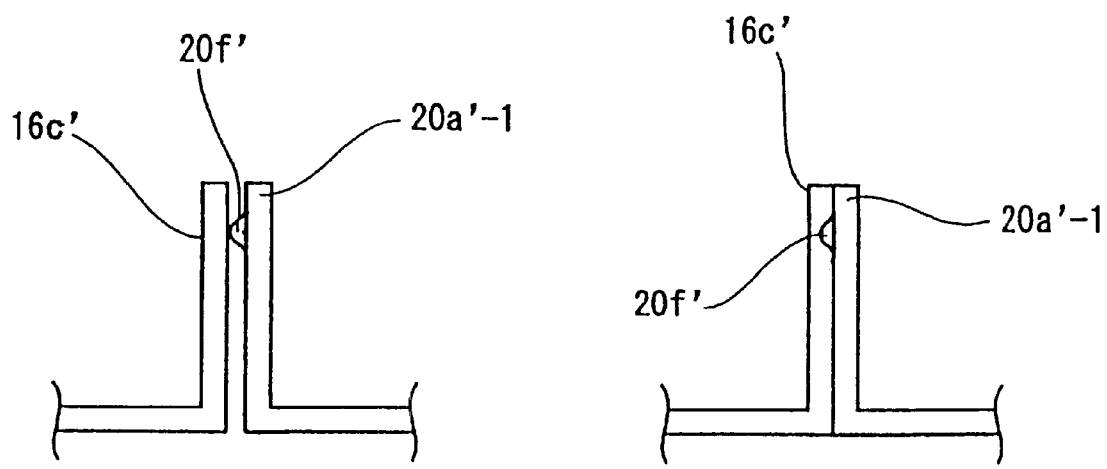
FIG. 18A
FIG. 18B

ELECTRICAL JUNCTION BOX

BACKGROUND OF THE INVENTION

1. Field of Invention

The present invention relates to an electrical junction box suitable to be connected, for example, to a wire harness in a vehicle, such as an automobile.

2. Description of Related Art

Recently, the increase of electrical and electronic component parts which are mounted in a vehicle has led to increase of circuits to be accommodated in electrical connection boxes and junction boxes in the vehicle. Thus, when forming branch circuits at a high density, it is necessary to mount a large number of component parts on a junction box, or the like, which causes increase of manufacturing complexity.

In a junction box disclosed in JP-A-2000-92660 and shown in present FIG. 19, bus bars 5A–5D are laminated one upon another between an upper case part 2 and a lower case part 3, with insulation plates 4A–4E interposed between the bus bars 5A–5D. The upper case part 2 has a connector receiving portion 2a, a relay receiving portion 2b, and a fuse receiving portion 2c, on which in use connectors 6, relays 7 and fuses 8 are mounted, respectively. Terminals of the connectors 6, the relays 7 and the fuses 8 are connected to tabs 5a projecting from the bus bars directly or are connected to the bus bars through relaying terminals. The lower case part 3 has also a connector receiving portion 3a to connect connectors to tabs projecting from the bus bars.

In the junction box 1, with the increase of the number of circuits, the area and the number of layers of the bus bars increase and thus the size of the junction box becomes large. If the connector, relay and fuse receiving portions are arranged on both the upper and lower case parts to connect connectors, relays and fuses to internal circuits of the junction box, it is possible to make the area of the junction box smaller than in the case where the receiving portions are mounted on only the upper case part or the lower case part.

However, if the connector, relay and fuse receiving portions are mounted on both the upper and lower case parts such that they are opposed vertically, the bent tabs of bus bars must overlap each other and thus cannot be easily arranged. In this case, it is necessary to form tabs on bus bars of other layers, which causes an increase of number of layers of bus bars, and thus leads to the increase of the height of the junction box. That is, the junction box is necessarily large.

Further, the above-described junction box is so constructed that the bus bars are connected to the connectors, the fuses and the relays. Thus, when the specification of the connection between the internal circuit and the fuses and/or the relays is altered, it is necessary to alter the entire internal circuit. Consequently, the above-described junction box is incapable of allowing a circuit alteration easily.

Some proposals have been made for replaceable modules in electrical circuits of automobiles.

U.S. Pat No. 5,179,503 shows a modular automobile power distribution box having replaceable modules carrying relays or fuses. The relays or fuses in each module are directly connected to terminals of leads of wire harnesses. A pair of bus bars connect power terminals to the fuses of three maxi-fuse modules. There is no discussion of interconnection of the modules.

U.S. Pat. No. 5,581,130 discloses removable multi-function modules in individual casings which are mounted on a circuit board. Each module is electrically connected to the power supply distribution layer of the board by a pin. Alternatively, three modules are shown connected together by two electrical and mechanical coupling bars.

SUMMARY OF THE INVENTION

It is an object of the present invention to provide a junction box which can be made thin and can keep to a minimum the number of layers of bus bars accommodated in the junction box and which can permit a circuit alteration easily.

According to the present invention, there is provided an electrical junction box adapted to provide electrical connection to a plurality of electrical connectors, a plurality of fuses and a plurality of relays, having (i) upper and lower case parts joined together to provide a casing;

(ii) a base circuit having a plurality of first bus bars and insulation layers stacked together with said insulation layers interposed between the bus bars in a stacking direction, a base circuit being mounted in the casing and the first bus bars being arranged to provide electrical connection to electrical connectors in use;

(iii) a fuse circuit having a fuse circuit substrate, which is discrete from the base circuit, and a plurality of second bus bars fixed on the fuse circuit substrate, the fuse circuit being mounted in the casing and said second bus bars being arranged to provide electrical connection to fuses in use; and (iv) a relay circuit having a relay circuit substrate, which is discrete from the base circuit, and a plurality of third bus bars fixed on the relay circuit substrate, the relay circuit being mounted in the casing and the third bus bars being arranged to provide electrical connection to relays in use;

(v) wherein the second bus bars and the third bus bars are joined to the first bus bars by welding.

In the junction box of the present invention described above, the first bus bars of the base circuit are provided separately from the second bus bars for fuses and the third bus bars for relays by dividing the circuits, and are joined by welding. The respective substrates are discrete, i.e. separate elements in the casing, as shown in the embodiments below. This is in contrast with the conventional method, in which electrically conductive sheets are punched to form unitarily the connector connection circuit, the fuse connection circuit, and the relay connection circuit and form tabs to be connected to connectors, tabs to be connected to fuses, and tabs to be connected to relays, and stacked in a single stack, the circuits thus being handled and arranged in a complicated manner, which causes increase of the area of the bus bars and the use of a large number of the bus bars. On the other hand, according to the present invention, because the circuits are divided and welded, it is possible to avoid the complication of tabs overlapping each other and avoid a large number of bus bars. Thus, it is possible to form a thin or compact junction box. Further, because the circuits of the bus bars can be arranged and disposed easily, the area of each bus bar can be reduced. Consequently, even though the bus bars are separately provided for the connector connections on the one hand and the fuse connections and the relay connections on the other hand, it is possible to reduce the total area of the bus bars and avoid increase of the area of the junction box.

In one form of the invention, the fuse module having the fuse connection circuit and the relay module having the relay connection circuit are separately provided, i.e. on discrete substrates. Thus, if any feature of the specification of the fuse and the relay is altered, only the fuse module or the relay module needs to be changed to produce a different design of box. That is, the construction can permit alteration of the specification easily. On the other hand, if the specification of a connector connection is altered, only the base circuit is changed. Thus, the construction can cope with a circuit alteration easily.

In an alternative construction, it is possible to combine the fuse module and the relay module with each other to form a fuse/relay composite module which receives fuses and relays on the same substrate which has bus bars for fuses and relays on it. In this case, if it is necessary to connect the circuit of any of the bus bars for fuses to any of the bus bars for relays, the respective bus bars are welded to each other or bars may be integrally formed.

Terminals of the first bus bars may be disposed in sockets of a connector receiving portion formed in the upper case part and/or the lower case part directly or through relaying terminals. Fuse-mounting sockets on a member carried on the substrate of the fuse module and/or relay-mounting sockets on a member carried on the substrate of the relay module may be exposed to the exterior of the upper case part and/or the lower case part through openings. This allows fuses and relays to be installed and replaced from the outside. For example, an opening is formed at one side of the upper case part to expose the fuse-mounting sockets and another opening is provided to expose the relay-mounting portion at one side of the lower case.

Alternatively, fuse-mounting sockets and/or relay mounting sockets may be provided integrally on the case parts, e.g. with terminals of the bus bars projecting into these sockets.

The second bus bars and third bus bars may thus individually be directly connected to terminals of fuses and terminals of relays, respectively.

Preferably, each second bus bar and each third bus bar has a terminal portion formed by bending a horizontal portion thereof upward at one end of the horizontal portion which is fixed to the respective substrate and a pressure contact groove is formed at the end of the terminal portion thereof to allow a terminal of a fuse or a relay to be connected thereto under pressure. The other end of the horizontal portion of each bus bar may be welded to one of the first bus bars. This construction allows the second and third bus bars to be connected to fuses and relays without using relaying terminals.

The first bus bars may be welded to the welding portions of the second bus bars and/or the third bus bars by any suitable method, such as ultrasonic welding, resistance welding, laser welding or gas welding. Preferably, the portions which are welded project externally from the insulation layers and the respective substrate.

Use of such welding techniques does not reduce reliability of the electrical connection. By arranging the welded portions parallel with one another, ultrasonic welding, resistance welding, laser welding or gas welding can be efficiently accomplished. The bus bar portions are, for example, welded to each other by layering them on each other horizontally or by bending them vertically and locating them alongside each other vertically. It is possible to connect the connector connection bus bars to the fuse connection bus bars and the relay connection bus bars by means of fit-in of male and female terminals.

The bus bars of the base circuit and the insulation layers are alternately laminated on each other inside the upper and lower case parts. When accommodating an electronic control unit in the upper and lower case parts, preferably, the welded joints of the first bus bars to the second bus bars and/or the third bus bars are located in a dead space located below the electronic control unit.

The upper and lower case parts may accommodate a circuit consisting of electric wires and pressure contact terminals and/or a circuit of an FPC, PCB or the like.

BRIEF DESCRIPTION OF THE DRAWINGS

Embodiments of the invention will now be described by way of non-limitative examples with reference to the accompanying drawings, in which:

FIG. 17 is a schematic view showing the welding of a fuse connection bus bar of the fuse module of FIG. 16 and a connector connection bus bar of the connector module.

FIGS. 18A and 18B show the welding of vertical welding tabs.

DETAILED DESCRIPTION OF PREFERRED EMBODIMENTS

Figure 1:
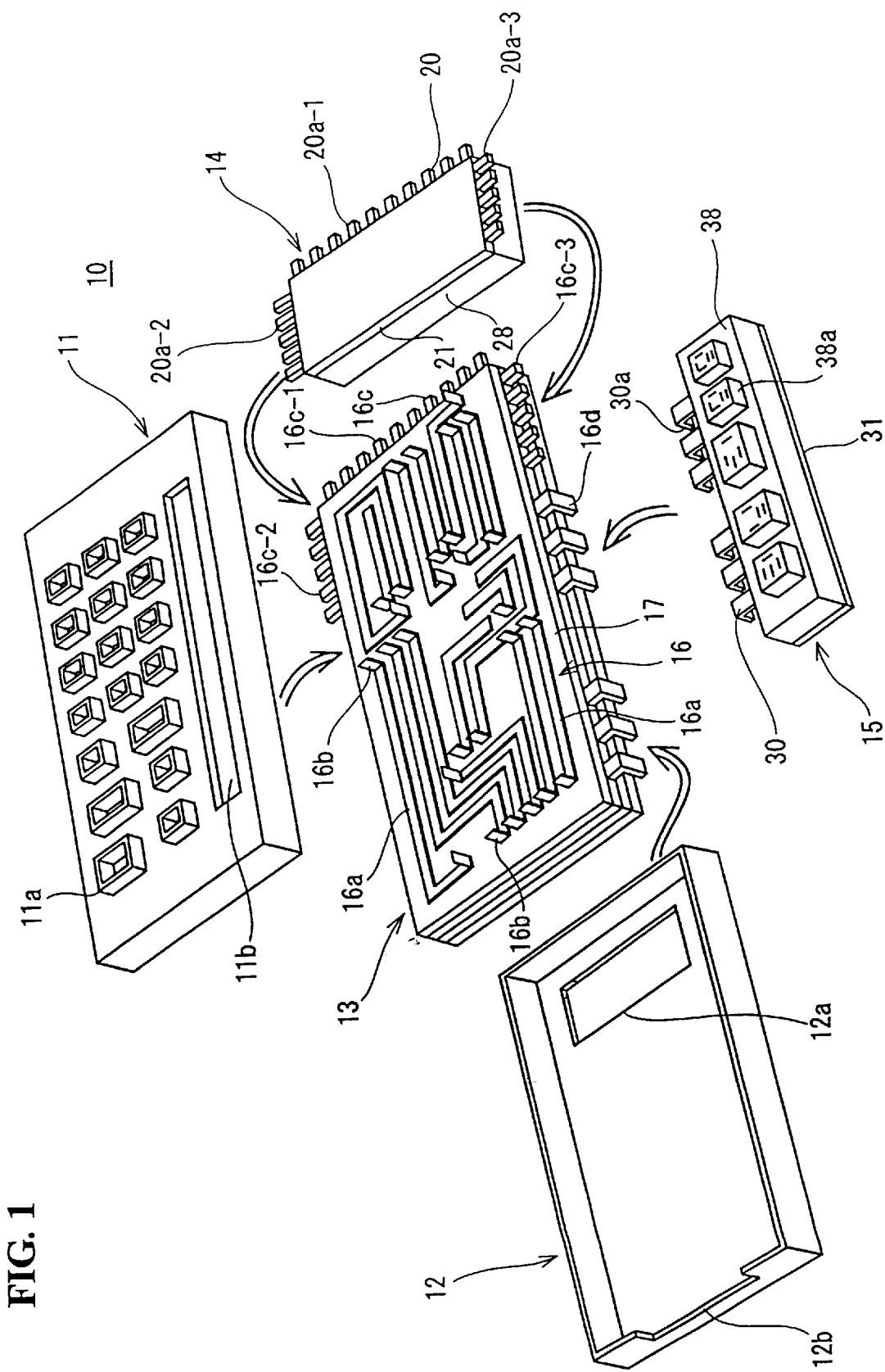
FIG. 1 is a schematic exploded perspective view of a junction box which is a first embodiment of the present invention.

FIG. 1 is a schematic exploded perspective view showing component parts constituting a junction box 10 which in use is mounted in a vehicle body and is connected to a wire harness of the vehicle.

FIG. 1 shows a lower case part 11, an upper case part 12, a base circuit 13, a fuse module 14 and a relay module 15. Although it is not shown in FIG. 1, the junction box 10 also accommodates an electronic control unit 40 as shown in FIGS. 2 to 5. The case parts 11,12 are connectable by conventional locking means, e.g. snap-fit locking elements, to form a casing, and are individually molded in suitable synthetic resin material.

Figure 2:
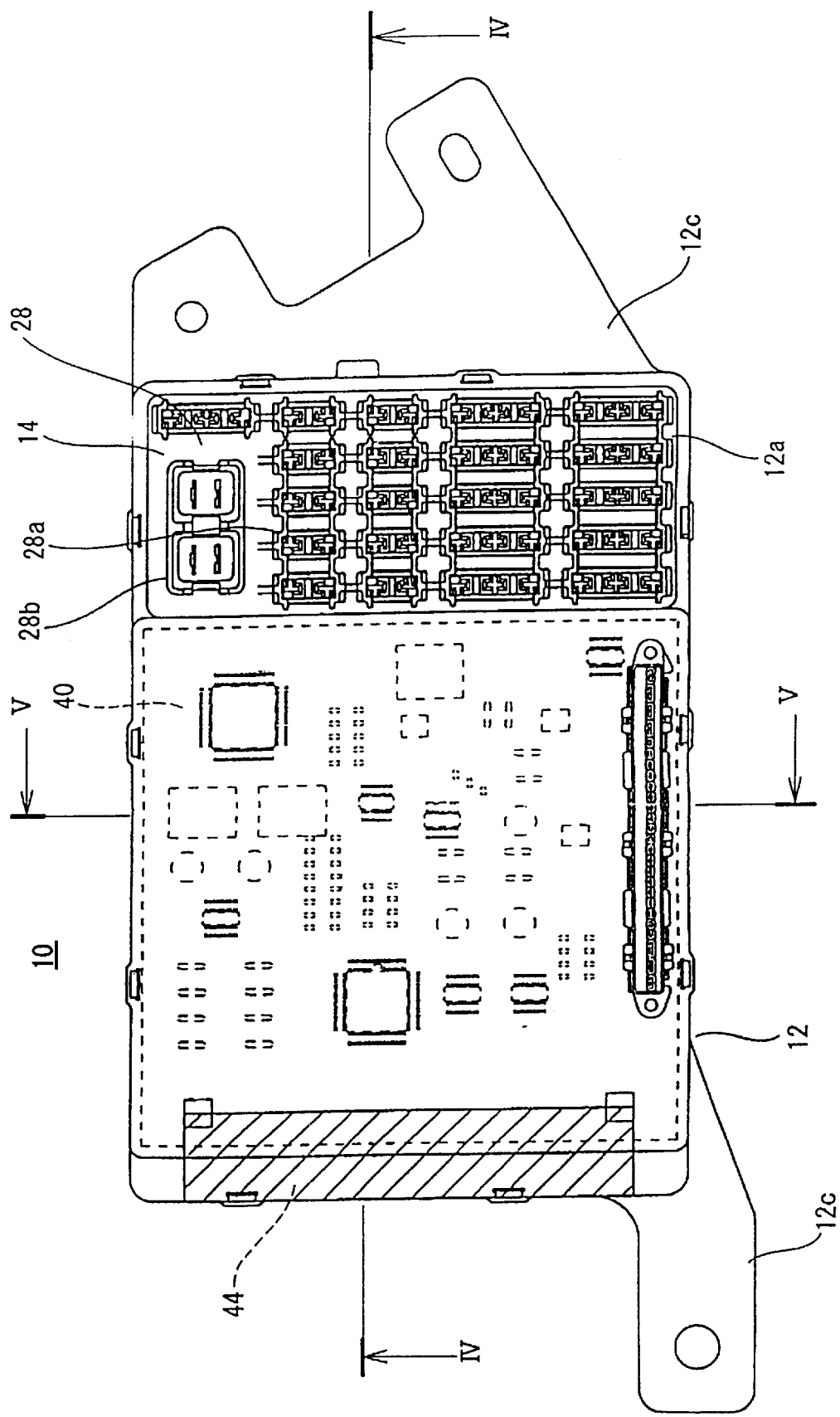
FIG. 2 is a plan view of the junction box of FIG. 1 in its assembled state.
Figure 3:
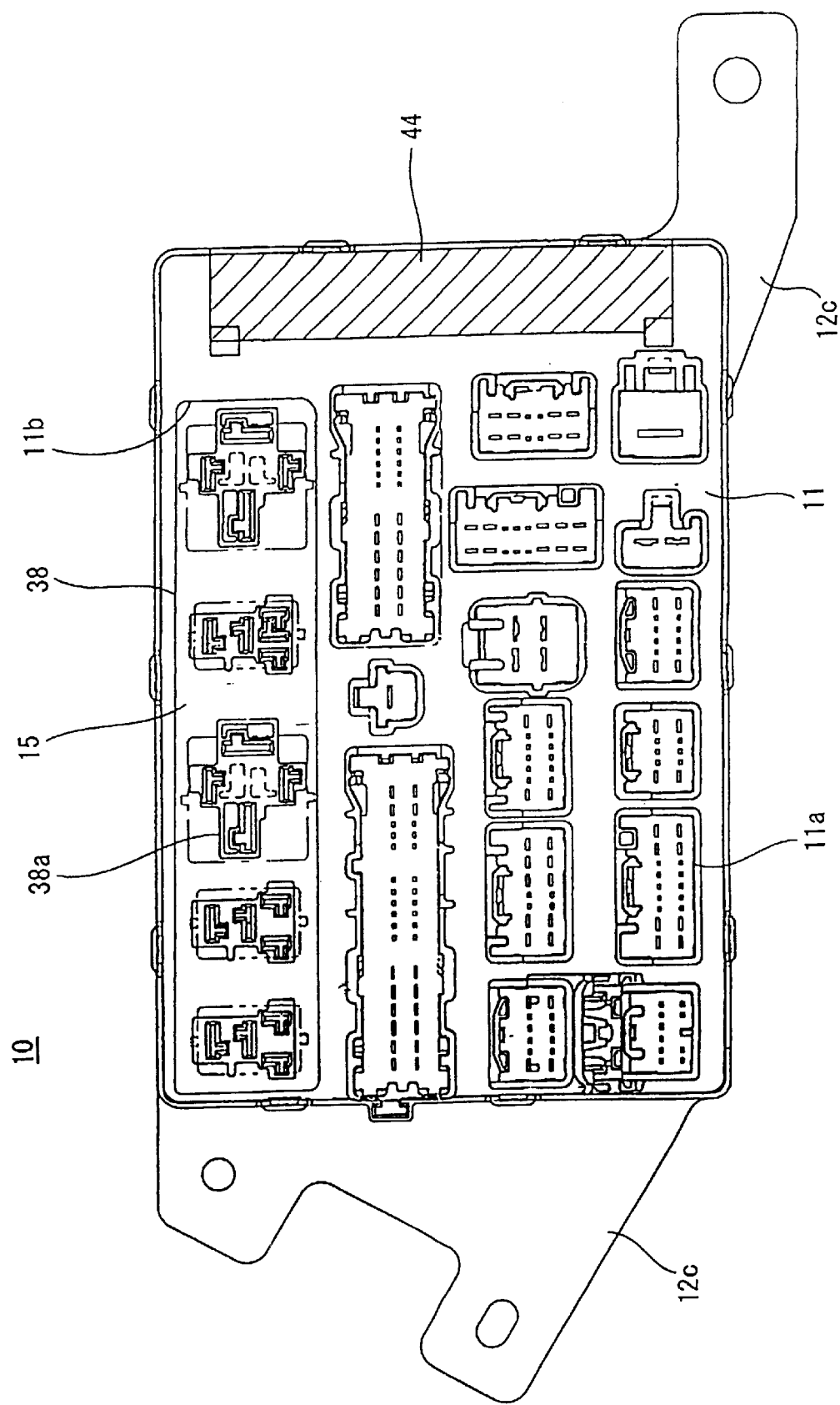
FIG. 3 is a bottom view of the junction box as shown in FIG. 2.
Figure 4:
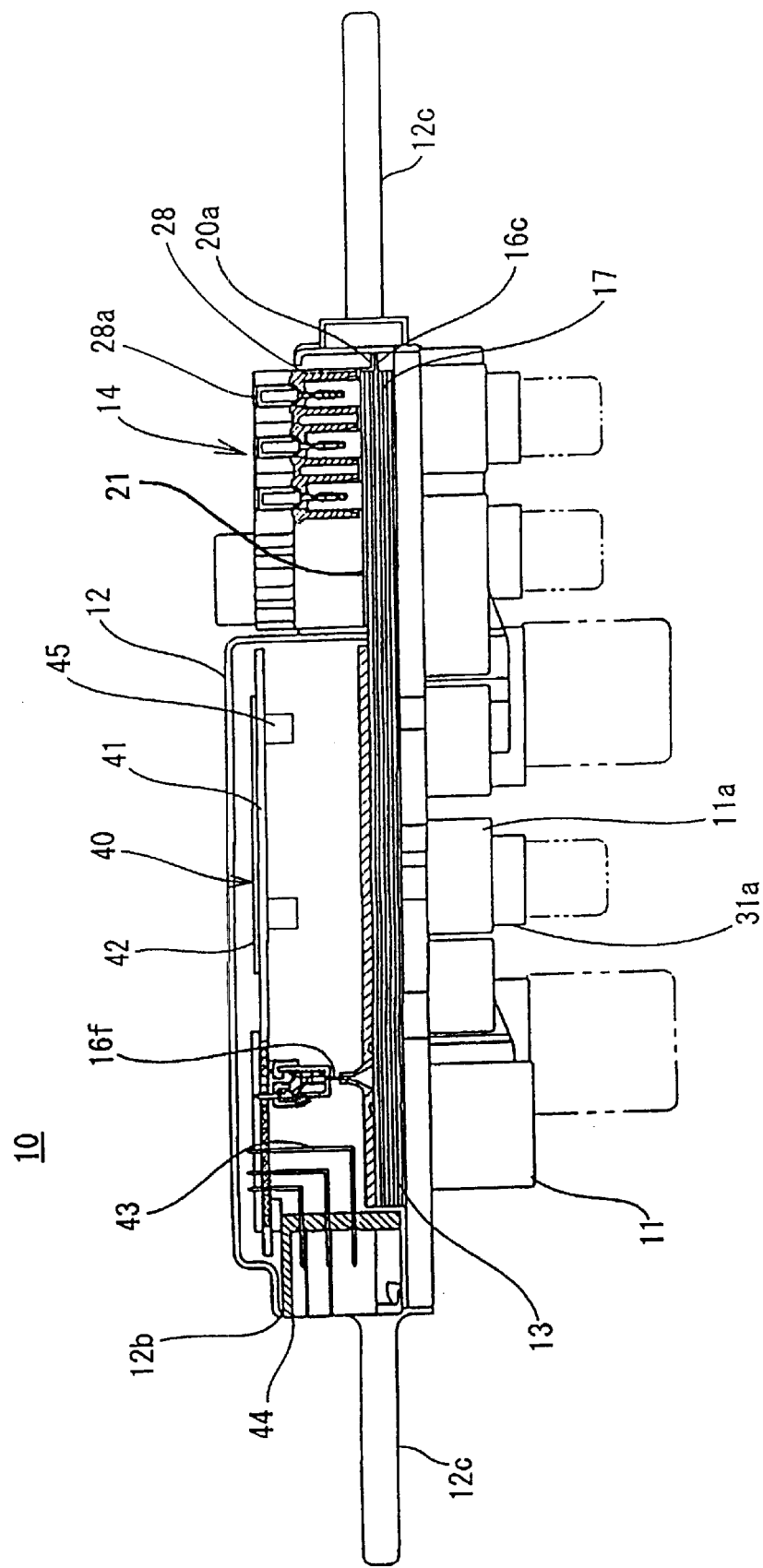
FIG. 4 is a sectional view on line IV—IV of FIG. 2.

The lower case part 11 has at its exterior a plurality of projecting connector receiving portions 11a shaped as sockets and an opening 11b for relays formed adjacent one longitudinal side. The upper case part 12 has an opening 12a for fuses adjacent a widthwise side. The case parts 11 and 12 are locked to each other by fitting their peripheral walls together. Although it is not shown in FIG. 1, the upper case part 12 has a bracket 12c for fixing it to a vehicle body projecting from a part of its peripheral wall, as shown in FIGS. 2 to 4. The upper case part 12 has also a connector-fitting notch 12b formed at a part of its widthwise peripheral wall.

The base circuit 13 constituting a connector module has a connector connection bus bar assembly 16 comprising layers of bus bars stacked alternatively with insulation plates 17. In this embodiment, the bus bar assembly 16 consists of four layers laminated one upon another and connected as necessary through the plates 17. The size of the base circuit 13 is such that it is not located at the position of the relay opening 11b when the base circuit 13 is accommodated in the case parts 11,12.

Each bus bar layer of the connector connection bus bar assembly 16 of the base circuit 13 is a circuit portion 16a having a required configuration obtained by punching a conductive sheet or plate. Tabs 16b project from the circuit portions 16a toward the lower case part 11 so as to project through terminal holes seen in FIG. 3 into the connector receiving portions 11a of the lower case part 11. Connectors (not shown) provided on the end of a wire harness (not shown) are in use fitted in the connector receiving portions 11a to connect terminals of the connector with the tabs 16b.

The layers of bus bars of the base circuit 13 are interconnected as necessary through the insulation plates in a conventional manner.

The circuit portions 16a of the bus bar assembly 16 have welding tabs 16c, 16d projecting from the periphery of the stack of the insulation plates 17 at least two sides thereof. More specifically, the welding tabs 16c project at and near one widthwise side of the stack of insulation plates 17 and are welded to welding tabs 20a of fuse connection bus bars 20 of the fuse module 14. Thus, welding tabs 16c-1, 16c-2 and 16c-3 are welded to welding tabs 20a-1, 20a-2 and 20a-3, respectively by laminating the welding tabs 16c-1 and 20a-1, 16c-2 and 20a-2 and 16c-3 and 20a-3 on each other horizontally. The welding tabs 16d project at one longitudinal side of insulation plate 17 and are welded to welding tabs 30a of relay connection bus bars 30 of the relay module 15. The tabs 16d, 30a are bent vertically and located alongside each other for welding. As can be seen, the tabs 16c-1, 16c-2 and 16c-3 are arranged parallel with one another in arrays.

The fuse module 14 has a large number of fuse connection bus bars 20 fixed to a surface of a rectangular insulating plate-shaped substrate 21. The fuse connection bus bars 20 are separate from each other and in use individually connected to terminals of fuses which are removably fitted to the junction box. The substrate 21 carries a molded synthetic resin body 28 (partially shown in section in FIG. 4) which provides fuse receiving socket portions 28a projecting from its front surface (lower surface in FIG. 1) and has fusible link receiving socket portions 28b projecting from its front surface near one of its short sides. The socket portions 28a and 28b correspond in location to the position of the opening 12a of the upper case part 12 and are exposed to the outside when the fuse module 14 is accommodated in the case parts 11,12.

Figure 6:
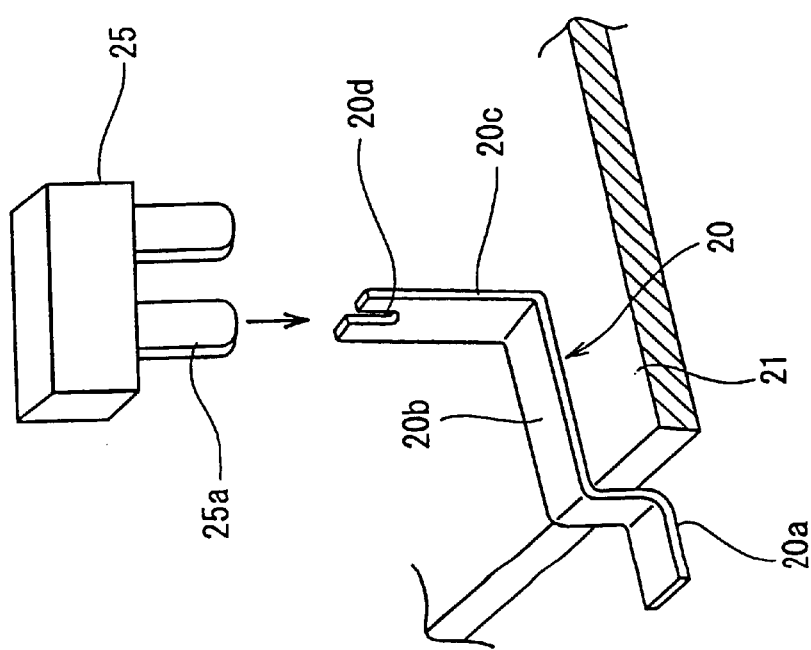
FIG. 6 is a schematic view of a fuse connection bus bar of the box of FIG. 1.

As shown schematically in FIG. 6 (in which the synthetic resin body 28 is omitted), each fuse connection bus bar 20 of the fuse module 14 has a horizontal portion 20b fixed to the substrate 21, a terminal portion 20c formed by bending bus bar 20 upward at one end of the horizontal portion 20b, and a pressure contact groove 20d formed at the upper end of the terminal portion 20c to allow a terminal 25a of a fuse 25 to be fitted. The terminal portions 20c lie at the appropriate positions in the body 28. The other end of the fuse connection bus bar 20 is formed as a welding portion 20a and stepped at the edge of the substrate 21 to allow overlap of the welding portion 20a and the welding portion 16c of the connector connection bus bar 16. Thus, as seen at the right-hand side of FIG. 4, the respective welding portions 20a and 16c lie contiguous and overlapping.

The relay module 15 has a construction similar to that of the fuse module 14. More specifically, the relay module 15 has a large number of relay connection bus bars 30 fixed to an elongate insulating substrate 31. The relay connection bus bars 30 are individually provided and connected in use to respective terminals of relays which are removably fitted to the junction box. The relay module 15 has a molded synthetic resin body 38 carried on the substrate 31 and providing relay receiving socket portions 38a in a row projecting from its lower surface (upper surface in FIG. 1). The relay receiving socket portions 38a are located at the position of the opening 11b of the lower case part 11 and so are exposed to the outside to receive relays when the relay module 15 is accommodated in the case parts 11,12.

Figure 5:
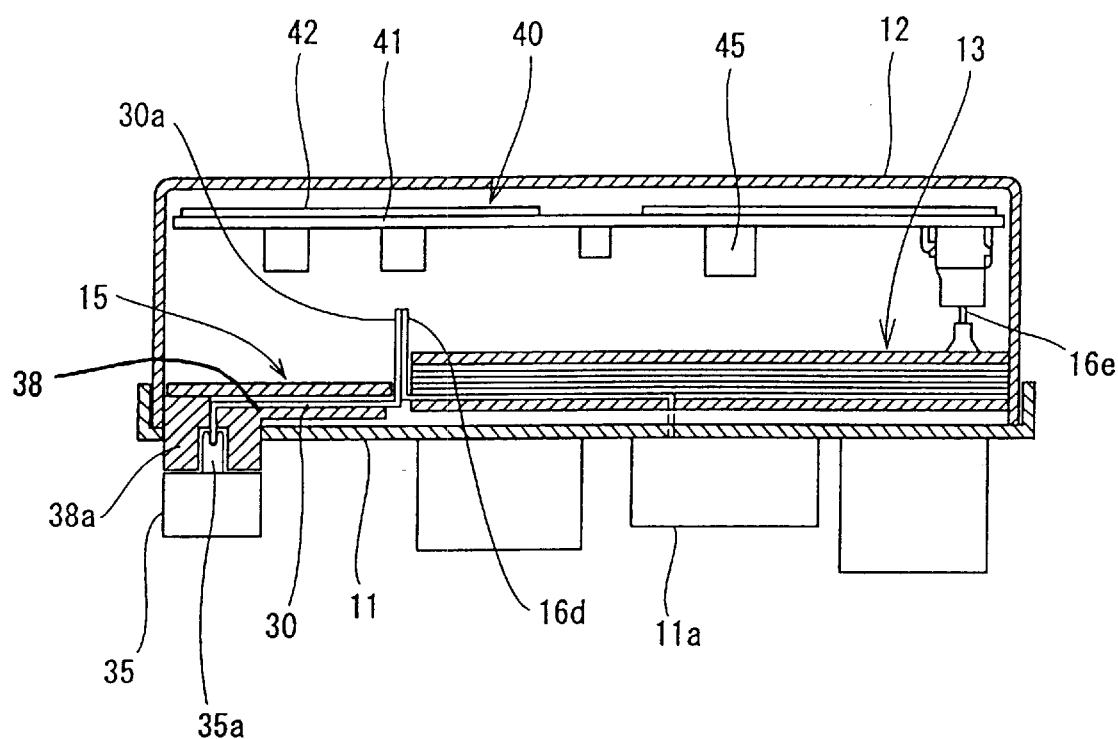
FIG. 5 is a sectional view on line V—V of FIG. 2.
Figure 7:
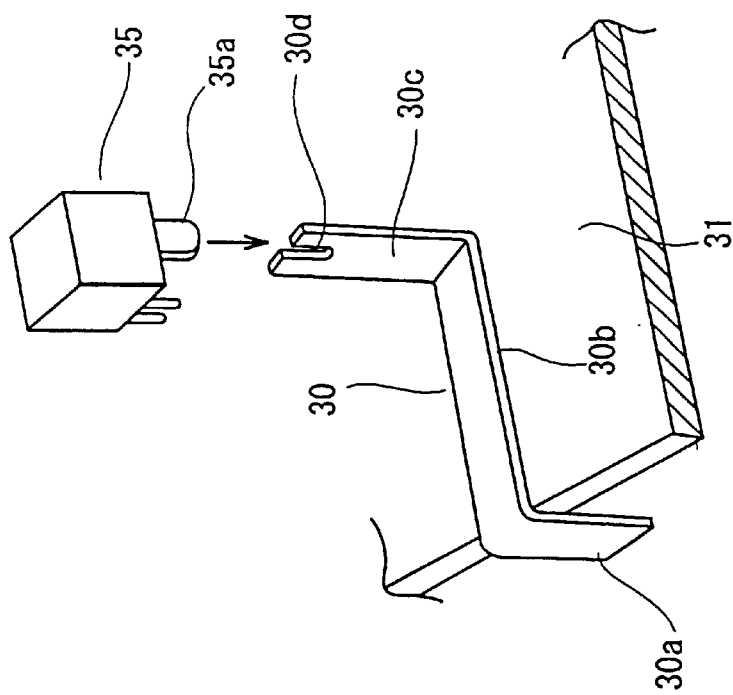
FIG. 7 is a schematic view of a relay connection bus bar of the box of FIG. 1.

As shown schematically in FIG. 7 (in which the synthetic resin body 38 is omitted), each relay connection bus bar 30 of the relay module 15 has a horizontal portion 30b fixed to the substrate 31, a terminal portion 30c formed by bending the bus bar 30 upward at one end of the horizontal portion 30b, and a pressure contact groove 30d formed at the upper end of the terminal portion 30c to allow a terminal 35a of a relay 35 to be fitted. The terminal portions 30c lie at the appropriate positions in the body 38. The welding portion 30a is formed by bending the other end of the horizontal portion 30b downwardly so that the welding portion 30a and the welding portion 16d of the connector connection bus bar 16 can be aligned vertically next to each other, as shown in FIG. 5.

In assembling the junction box 10, initially the welding portions 20a of the fuse connection bus bars 20 are connected to the respective welding portions 16c of the connector connection bus bars 16 by layering these welding portions one on the other, with the fuse module 14 disposed over one end of the base circuit 13, and welding the welding portions together. Then, the welding portions 30a of the relay connection bus bars 30 are connected to the respective welding portions 16d of the connector connection bus bar 16 by placing these welding portions adjacent each other, with the relay module 15 disposed at one side of the base circuit 13, and welding the adjacent welding portions together. The welding operations may be carried out by ultrasonic welding, resistance welding, laser welding or gas welding.

The fuse module 14 is thus mounted over the base circuit 13 at a short side thereof, and the relay module 15 is disposed adjacent the base circuit 13 at one longitudinal side thereof to integrate the base circuit 13, the fuse module 14, and the relay module 15 with one another. Then, the subassembly of the base circuit 13, the fuse module 14 and the relay module 15 is accommodated in the lower case part 11, with the synthetic resin body 38 of the relay module 15 exposed to the outside at the opening 11b of the lower case part 11.

Then, an electronic control unit 40 (not shown in FIG. 1) is mounted on the base circuit 13 at a position where the fuse module 14 is not mounted. The electronic control unit 40 has, at one side thereof, a connector portion 44 having bent and projecting conductive pins 43 connected with electric conductors 42 fixed to its substrate 41. The connector portion 44 fits in a connector receiving aperture of the lower case part 11 and the notch 12b on the periphery of the upper case 12, and is thus exposed to the outside. The conductors 42 of the electronic control unit 40 are connected to tabs 16e projecting from connector connection bus bars 16 of the base circuit 13 (only one tab 16f is shown in FIG. 4). The conductors 42 are connected to a large number of electronic component parts 45 mounted on the substrate 41 of the electronic control unit 40. The electronic component parts 45 are fixed to the underside of the substrate 41.

After the electronic control unit 40 is mounted on the base circuit 13, the upper case part 12 is mounted on the lower case part 11. At this time, the synthetic resin body 28 of the fuse module 14 is exposed at the opening 12a of the upper case 12, and the fuse receiving portions 28a and the fusible link receiving portions 28b project to the outside. The assembling of the junction box 10 is completed when the case parts 11,12 are fixedly connected to each other.

When the fuses 25, the fusible links and the relays 35 are inserted into their respective receiving portions 28a, 28b and 38a, they are fitted in the pressure contact grooves 20d, 30d to provide secure electrical connection.

In this embodiment, the welding portions 20a of the fuse connection bus bars 20 of the fuse module 14 and the welding portions 16c of the connector connection bus bars 16 of the base circuit 13 are welded to each other by layering them horizontally on each other. However, it is possible to weld the welding portions 20a and 16c to each other by bending the former downward and bending the latter upward and locating them adjacent each other. In this case, it is possible to utilize the dead space located below the substrate 21 of the fuse module 14.

It is also possible to utilize the dead space located below the electronic control unit 40 to weld the welding portions 20a and 16c to each other.

Figure 8A:
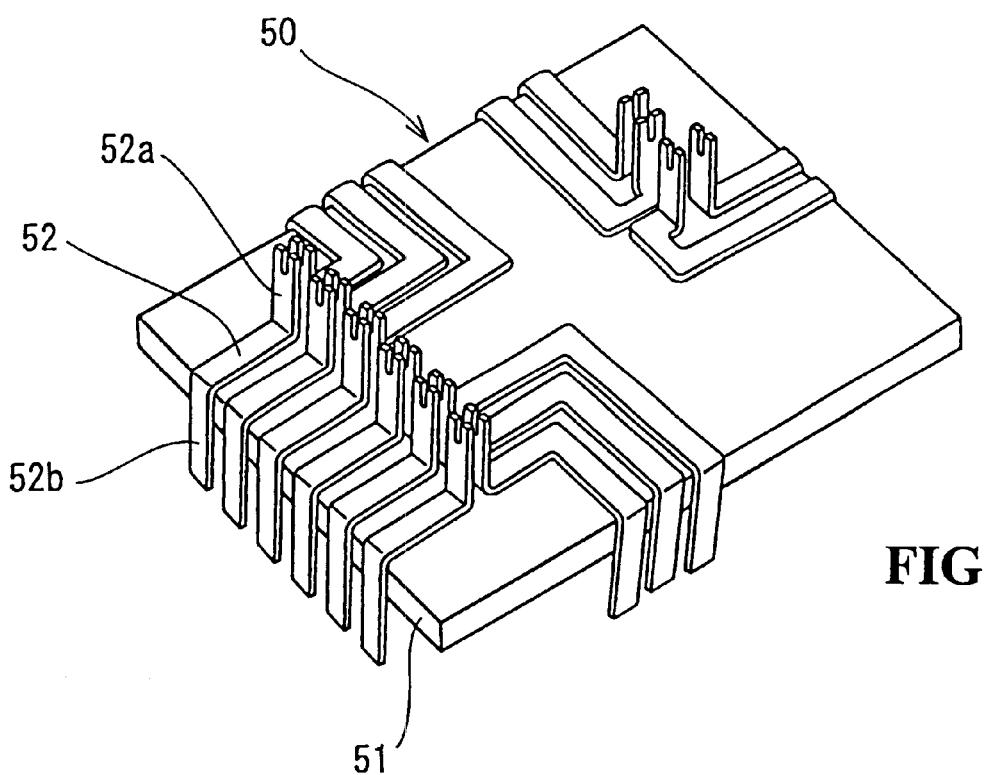
FIG. 8A is a schematic perspective view of a combined fuse and relay module of a junction box which is a second embodiment of the present invention.
Figure 8B:
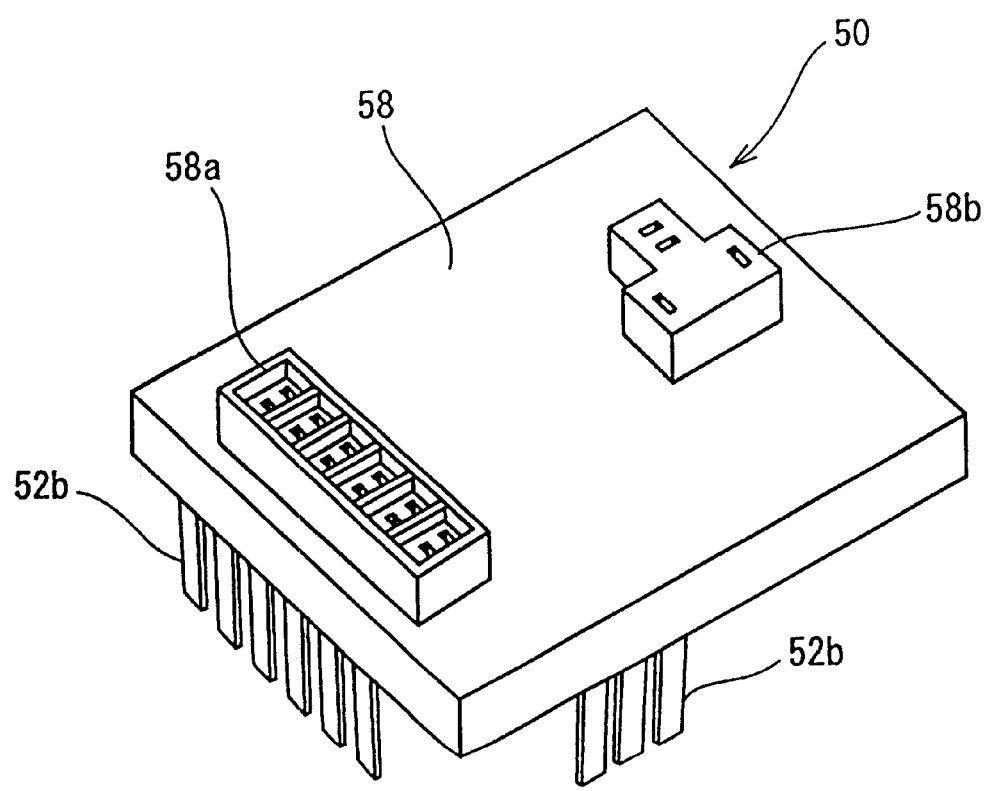
FIG. 8B is a further schematic perspective view of the module of FIG. 8A.

FIGS. 8A and 8B show parts of a second embodiment of the present invention in which a composite module 50 consisting of a fuse module integral with a relay module is used instead of the separate modules 14 and 15 of the first embodiment. The integrated module 50 has a plate-shaped insulating substrate 51 carrying bus bars 52 and a molded synthetic resin body 58 (omitted in FIG. 8A) which has a fuse receiving socket portion 58a and a relay receiving socket portion 58b integrally formed of molding resin.

The composite module 50 is disposed in the upper case part of a modified form of the junction box of FIGS. 1 to 7. Thus, only a large number of connector receiving portions are provided in the lower case part, whereas a large opening is formed in the upper wall of the upper case part to permit the body 58 to be arranged at the opening with the fuse receiving socket portion 58a and the relay receiving socket portion 58b exposed at the opening.

The bus bars 52 to be connected to terminals of fuses and relays are formed individually on the substrate 51. A terminal portion 52a to be connected to a terminal of a fuse or a relay is formed at one end of each bus bar 52. Welding portions 52b are formed at the other end of the respective bus bars 52. The welding portions 52b are arranged in parallel with one another along the periphery of the substrate 51, with the welding portions 52b projecting downward below the substrate 51. The terminal portions 52a project into the fuse receiving socket portion 58a and the relay receiving socket portion 58b.

The respective welding portions of the bus bars of the base circuit 13 and of the bus bars 52 of the composite module 50 are welded to each other to form a sub-assembly, with the composite module 50 disposed over the base circuit 13. In this state, the sub-assembly thus constructed is accommodated in the lower case and the upper case to assemble the junction box. The arrangement is analogous to that of FIGS. 1 to 7 and need not be described in detail.

The third embodiment shown in FIGS. 9 to 15 is generally similar to the first embodiment above, but differs primarily in that the molded synthetic resin bodies 28,38 of the fuse module 13 and relay module 14 are absent, the corresponding portions and functions being provided by the upper and lower case parts. The same reference numerals are used for corresponding components.

Figure 9:
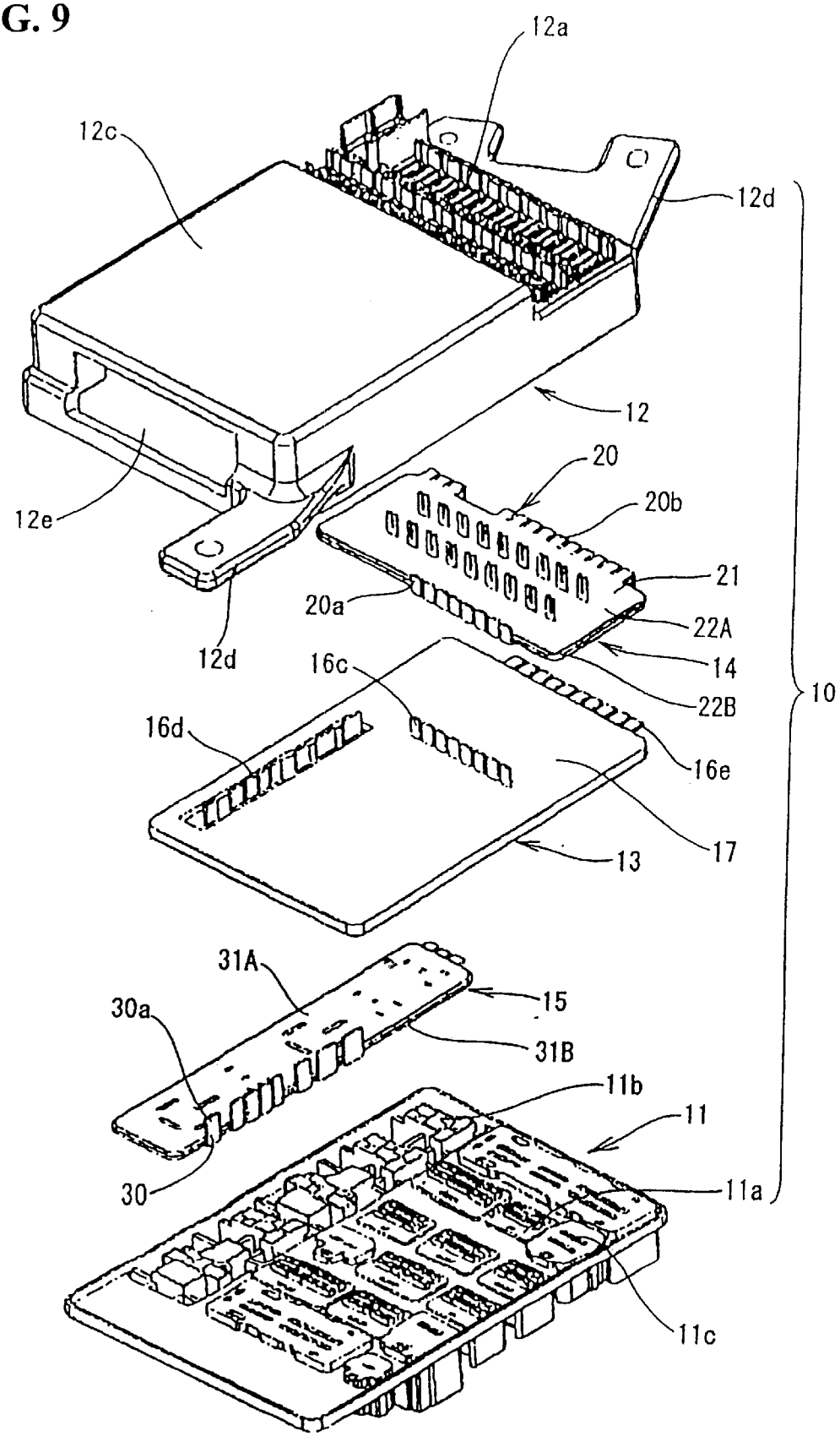
FIG. 9 is a schematic exploded perspective view of a junction box which is a third embodiment of the present invention.
Figure 10:
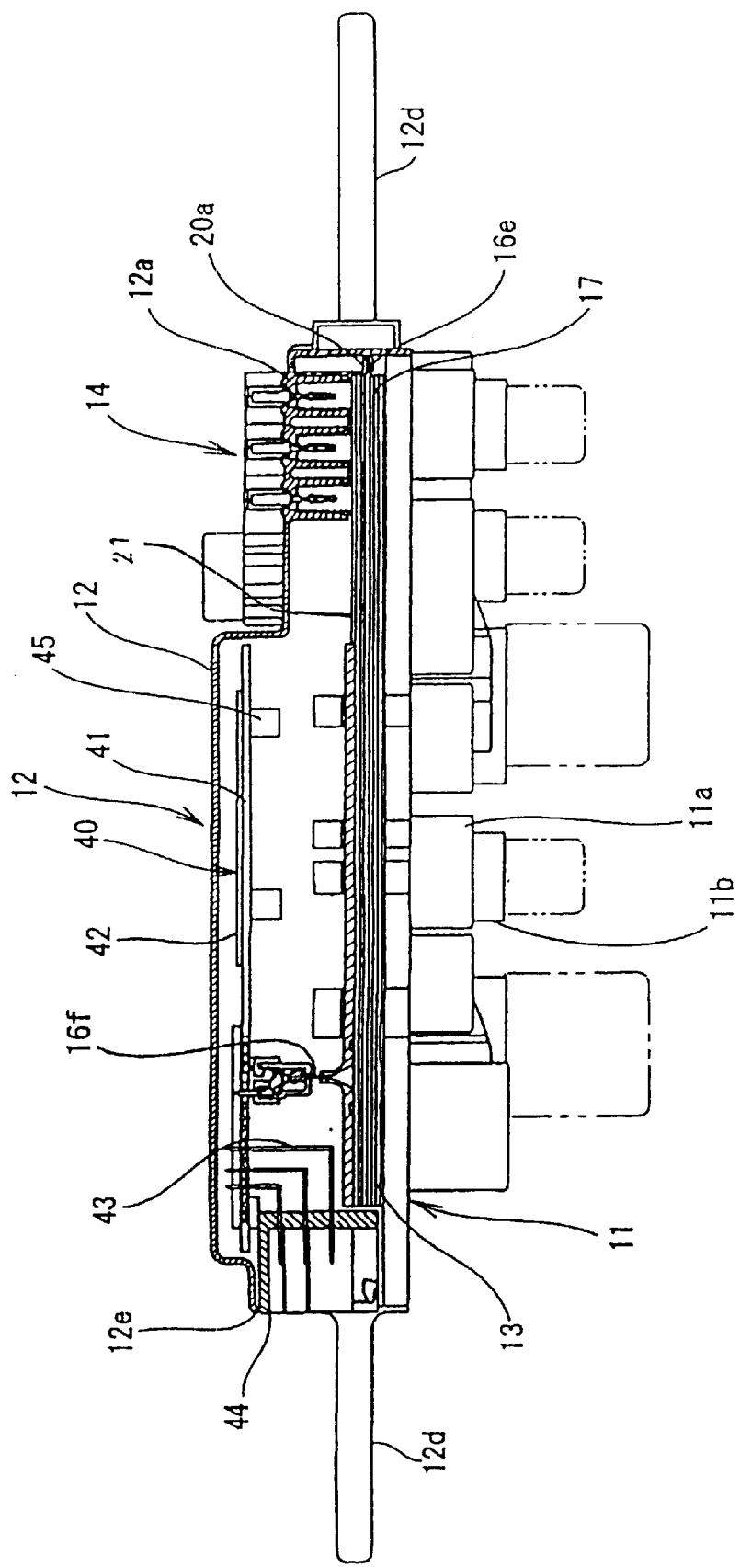
FIG. 10 is a sectional view of the junction box of FIG. 9 in its assembled state.
Figure 11:
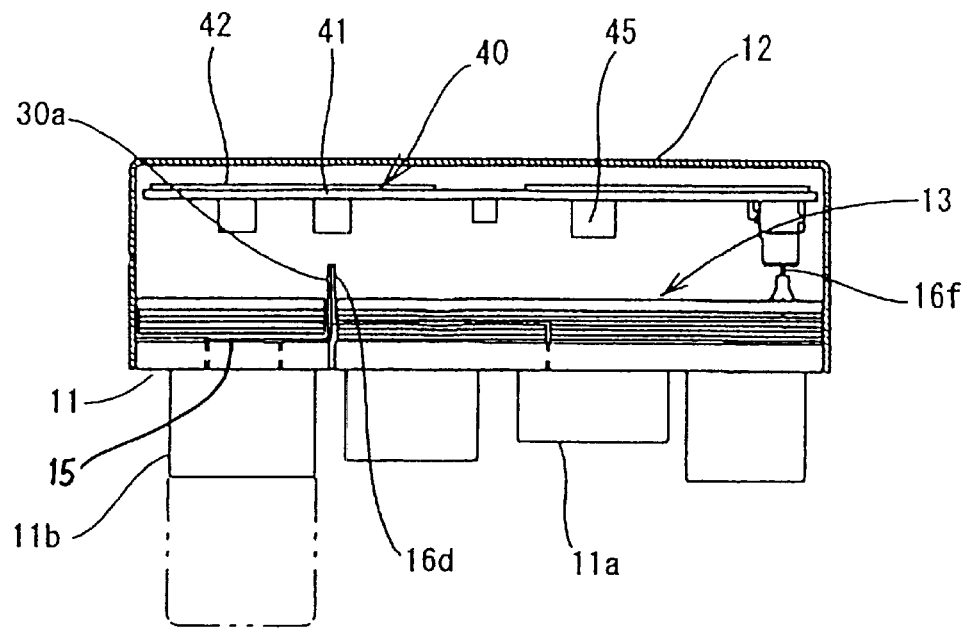
FIG. 11 is a sectional view of the junction box taken along a line perpendicular to the section line of FIG. 10.

FIG. 9 shows in schematic exploded perspective view component parts of a junction box 10 to be connected in use to a wire harness of a vehicle body. The box has a casing formed of molded synthetic resin upper and lower casing parts herein called lower case part 11 and upper case part 12. In the casing are a base circuit or connector module 13, a fuse module 14 and a relay module 15. Although not shown in FIG. 9, the casing formed by the lower case part 11 and the upper case part 12 accommodates an electronic control unit 40, as shown in FIGS. 10 to 13.

The lower case part 11 has a plurality of connector receiving portions 11a in the form of sockets projecting outwardly and a plurality of relay receiving portions 11b also in the form of sockets arranged in a row along one longitudinal side. The upper case part 12 has a fuse receiving portion 12a having sockets to receive a plurality of fuses, formed at one widthwise side. The remaining part of the upper case part 12 is formed as a closed portion 12c which covers and contacts the upper surface of an electronic control unit 40 housed within the case. The upper case part 12 also has a connector receiving portion or socket 12e on the periphery face of its other widthwise side. The lower case part 11 and the upper case part 12 are locked to each other by fitting their peripheral walls on each other. Suitable conventional locking fittings (not shown) may be provided. The upper case part 12 also has fixing brackets 12d projecting from its opposite ends, for fixing it to for example a vehicle body.

Figure 12:
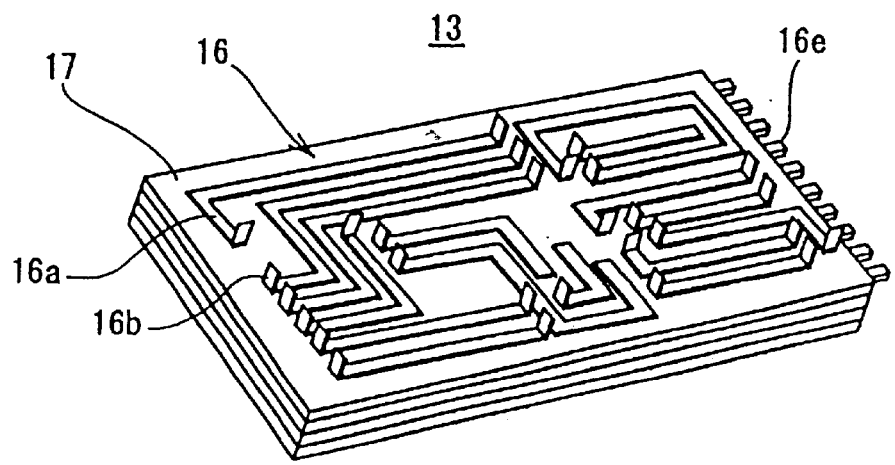
FIG. 12 is a schematic perspective view of a connector module of the box of FIG. 9 viewed from the underside thereof.

FIG. 12 is a perspective view showing the bottom side of the connector module 13 of FIG. 9. The connector module 13 has a plurality of layers of connector connection bus bars 16 laminated one upon another with interposed insulation plates of a stack 17. In this embodiment, there are four layers of the connector connection bus bars. In FIG. 9, the connector module 13 is schematically shown, with one insulation plate of the stack 17 as the uppermost layer. By molding in resin, it is possible to form the insulation plate stack 17 and a multi-layered integral assembly of the bus bars 16.

Each layer of the bus bars 16 of the connector module 13 has circuit portions 16a having a required configuration obtained by punching a conductive plate. At least one tab 16b stands perpendicularly from each circuit portion 16a towards the lower case part 11 to project through a terminal hole 11c of one of the connector receiving portions 11a of the lower case part 11. A connector (not shown) secured on one end of a wire harness is in use fitted in the connector receiving portion 11a to connect a terminal in the connector to the tab 16b.

The circuit portions 16a of the connector connection bus bars 16 have welding tabs 16c,16d projecting from holes of the insulation plate stack 17 and welding tabs 16e projecting from the periphery of the insulation plate stack 17. The welding tabs 16c,16e are welded to fuse connection bus bars 20 formed on the fuse module 14. The welding tabs 16d are welded to relay connection bus bars 30 formed on the relay module 15. The welding tabs 16c and the welding tabs 20a of the bus bars 20 are placed adjacent each other vertically. Similarly the welding tabs 16d and the welding tab 30a of the bus bars 30 are placed adjacent each other extending vertically. The welding tabs 16e are welded to welding tabs 20b of the fuse connection bus bar 20 by laminating them on each other vertically and horizontally. There are thus a plurality of sets of each of the welding tabs 16c,16d and 16e in each case parallel with one another.

Figure 13:
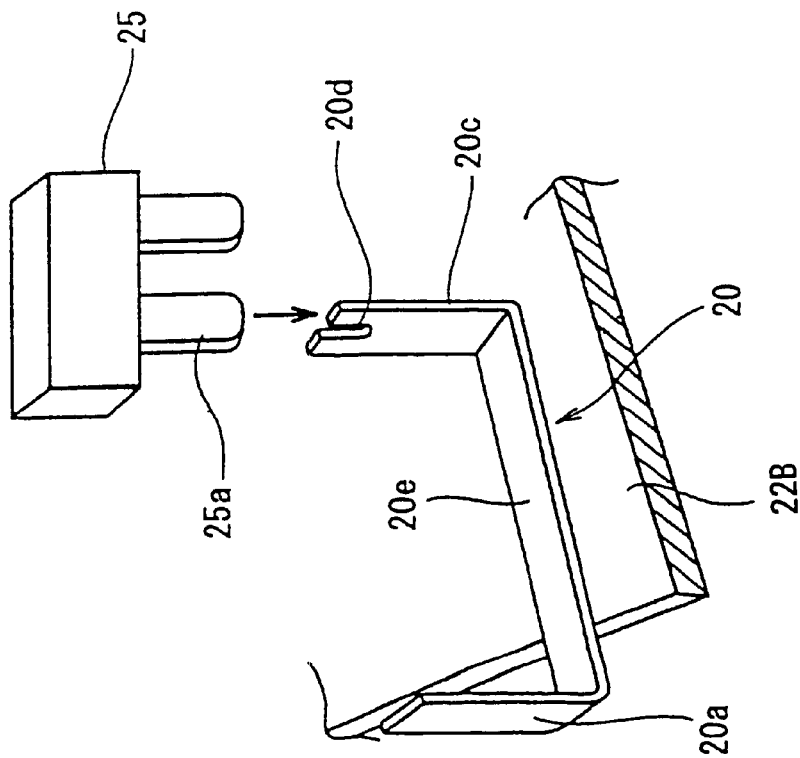
FIG. 13 is a schematic view of a fuse connection bus bar of the box of FIG. 9.

The fuse module 14 typically having the bus bars 20 arranged between two insulation plates 22A and 22B is formed by molding of synthetic resin. The bus bars 20 are separate from each other and individually connected to terminals of fuses. As shown in FIG. 13 (where the insulation plate 22A is not shown), each fuse connection bus bar 20 has a horizontal portion 30e, a terminal portion 20c formed by bending the bus bar 20 upward at one end of the horizontal portion 30e, and a pressure contact groove 20d formed at the upper end of the terminal portion 20c to allow a terminal 20a of a fuse 25 to be fitted therein. The other end of the bus bar 20 shown in FIG. 13 is formed as the welding tabs 20a, which is located to align with one of the welding tabs 16c of the bus bars 16. Other bus bars 20 of the fuse module 14 are shaped as in FIG. 6 to provide the welding portions 20a. It is possible to form a caulking rib on the insulation plate and form a hole on the bus bar to dispose the bus bar at a predetermined position by inserting the rib through the hole and caulk the rib to fix the bus bar to the insulation plate.

Figure 14:
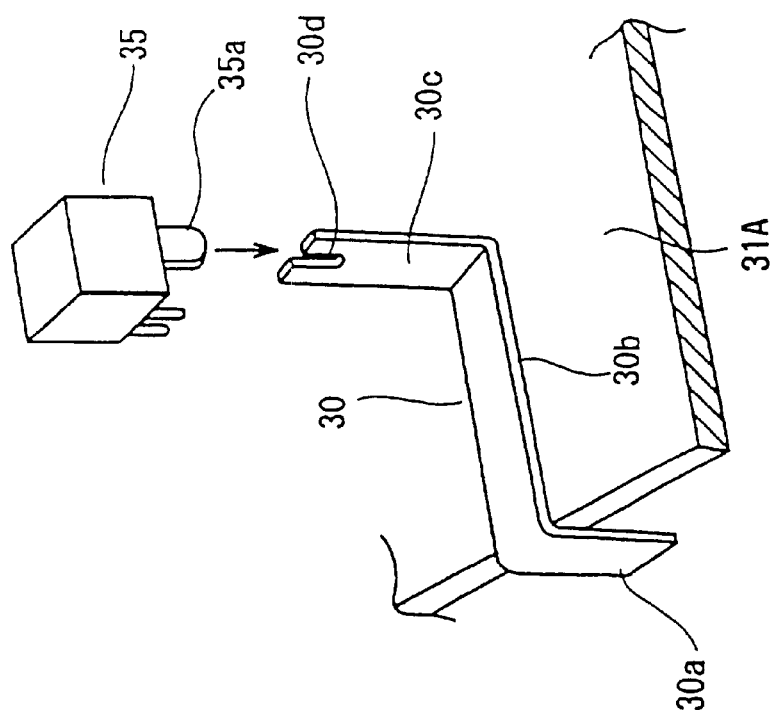
FIG. 14 is a schematic view of a relay connection bus bar of the box of FIG. 9.

The relay module 15 has a construction similar to that of the fuse module 14. More specifically, the relay module 15 has a large number of relay connection bus bars 30 fixed between upper and lower insulation plates 31A and 31B. The bus bars 30 are separate from each other and individually connected to terminals of relays. As shown in FIG. 14 (where the insulation plate 31B is not shown), each bus bar 30 of the relay module 15 has a horizontal portion 30b, a terminal portion 30c formed by bending the bus bar 30 upward at one end of the horizontal portion 30b, and a pressure contact groove 30d formed at the outer end of the terminal portion 30c to allow a terminal 35a of a relay 35 to be fitted therein. The welding tab 30a is formed by bending the other end of the horizontal portion 30b in the shape of an "L" to permit the welding tab 30a and the welding tab 16d of the bus bar 16 to be aligned adjacent each other vertically.

In assembling the junction box 10 of FIG. 9 initially, with the fuse module 14 disposed over one portion of the connector module 13, the welding tabs 20a and 20b of the fuse connection bus bars 20 are welded to the welding tabs 16c and 16e of the connector connection bus bars 16, by aligning the respective tabs next to each other and welding them together. Then, with the relay module 15 disposed under one side of the connector module 13 in the longitudinal direction thereof, the welding tabs 30a of the bus bars 30 are welded to the welding tabs 16d of the bus bars 16 by aligning the respective tabs next to each other and welding them together. The tabs 30a pass through apertures of the module 13. The welding tabs are welded to each other by a suitable welding method such as ultrasonic welding, resistance welding, laser welding or gas welding.

As described above, the fuse module 14 is mounted over the connector module 13 at one widthwise side thereof, and the relay module 15 is disposed under the connector module 13 at one longitudinal side thereof to integrate the three modules. Then, this subassembly of the three modules 13,14 and 15 is accommodated in the lower case part 11. In this case, the terminal portions 16b of the connector module 13 are disposed in the connector receiving portion 11a, and the terminal portions 30c of the relay module 15 are disposed in the relay receiving portion 11b.

Then, the electronic control unit 40 is mounted on the connector module 13 at a portion thereof on which the fuse module 14 is not mounted. The electronic control unit 40 has, at one side thereof, a connector portion 44 having bent and projecting conductive pins 43 connected with electrical conductors 42 fixed to a substrate 41 thereof. The electrical conductors 42 are connected to tabs 16f projecting from the bus bars 16 of the connector module 13. The conductors 42 are connected to a large number of electronic component parts 45 mounted on the substrate 41. The electronic component parts 45 fixed to the substrate 41, with the electronic components parts 45 projecting downward. The welding tabs of the bus bars 16,20 and 30 are disposed in a dead space below the electronic control unit 40.

After the electronic control unit 40 is mounted on the connector module 13, the upper case part 12 is mounted on the lower case part 11. At this time, the terminal portions 20c of the bus bars 20 fixed to the fuse module 14 become located in the fuse receiving portion 12a.

At this time, the connector portion 44 of the electronic control unit 40 is fitted in the opening 12e of the upper case part 12.

When the fuses 25 and the relays 35 are inserted into the fuse receiving portion 11a and the relay receiving portion 11b, respectively, they are fitted in and connected to the pressure contact grooves 20d,30d of the bus bars 20 and the bus bars 30, respectively.

Figure 15A:
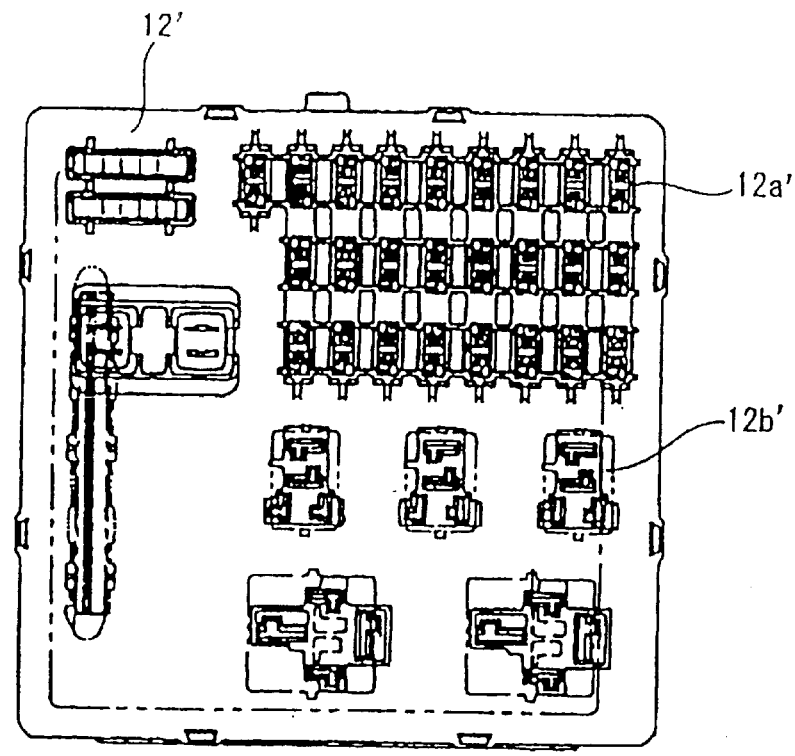
FIG. 15A is a plan view of the upper case of a junction box which is another embodiment of the present invention.
Figure 15B:
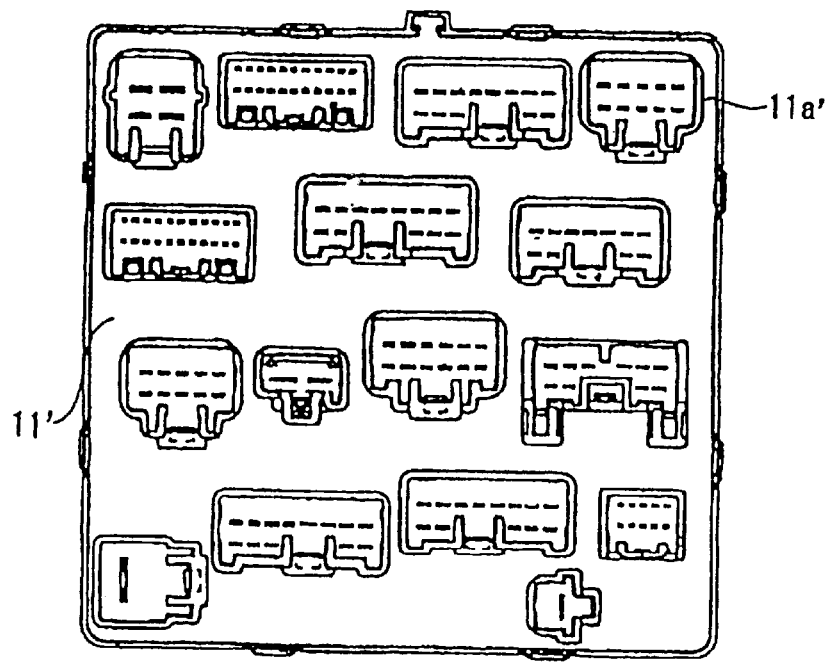
FIG. 15B is a bottom view showing the lower case of the junction box of the embodiment of FIG. 15A.

In the third embodiment of FIGS. 9 to 14, the fuse module and the relay module are separate from each other. Instead, the fuse module may be integral with the relay module to form a composite module. In this case, as shown in FIGS. 15A and 15B, a fuse receiving portion 12a' and a relay receiving portion 12b', in which terminal portions of bus bars of the composite module are disposed, are formed in the upper case 12'. Formed in the lower case 11' is a connector receiving portion 11a' in which terminal portions of bus bars of the connector module are disposed.

Figure 16:
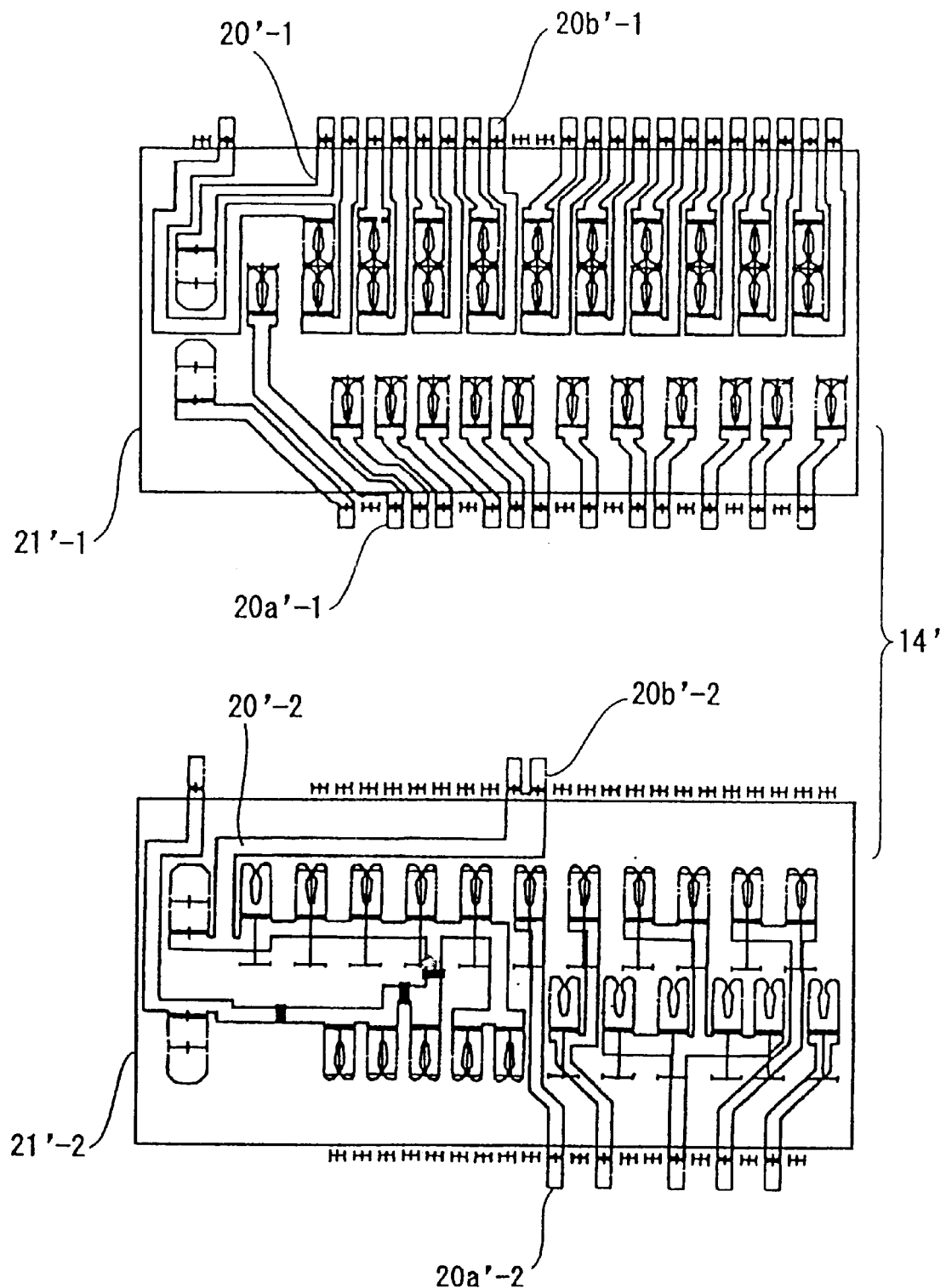
FIG. 16 is a schematic plan view showing layers of a fuse module having two-layer construction of still another junction box embodying the invention.
Figure 19:
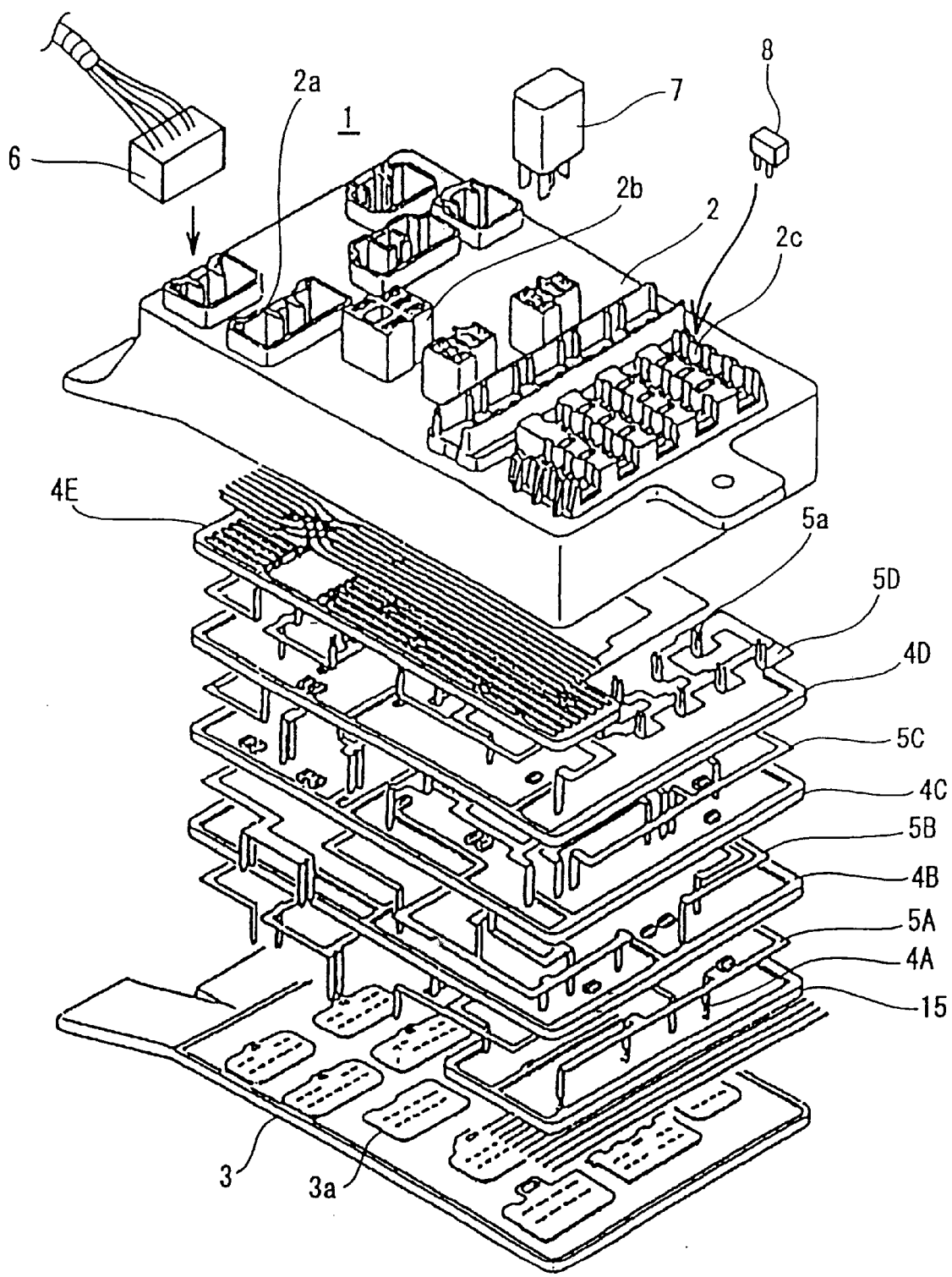
FIG. 19 is an exploded perspective view of a known junction box described above.

FIGS. 16 to 18 show parts of another embodiment of the present invention which is a modification of that of FIGS. 9 to 14. In particular, the fuse module and its welding tabs are modified, and also the welding tabs of the connector module, but other parts are generally as in FIGS. 9 to 14 and will not be described again.

In FIG. 16, the fuse module 14' has a two-layer construction comprising first and second rectangular insulation substrates 21'-1 and 21'-2 which are shown separately in FIG. 16 but are assembled one on top of the other. The substrate 21'-1 carries fuse connection bus bars 20'-1 and the substrate 21'-2 carries fuse connection bus bars 20'-2. Welding tabs at the ends of the bus bars to be welded to the bus bars of the connector module project parallel with one another from the opposed longer sides of each of substrates 21'-1 and 21'-2. As in the embodiment of FIGS. 9 to 14, welding tabs 20a'-1 and 20a'-2 projecting from one of the two longer sides are in the final construction bent in the shape of an "L" and stand upward (see FIGS. 17 and 18), with the welding tabs 20a'-1 and 20a'-2 not overlapping one another as seen in plan view in FIG. 16. In FIG. 16 all the welding tabs are shown extending horizontally, to illustrate their relative positions.

Welding tabs 20b'-1 and 20b'-2 projecting from the other of the two longer sides are not bent in the shape of an "L" but extend horizontally, with the welding tabs 20b'-1 and 20b'-2 also not overlapping one another as seen in plan view.

As shown in FIGS. 17 and 18, a small projection 20f is formed, by punching from the other side of the tab, on a welding surface of each of the welding tabs 20a'-1 and 20a'-2 projecting vertically. A similar small projection may be formed on each welding tab extending horizontally.

The vertical welding tabs 20a'-1 and 20a'-2 are welded to welding tabs 16c' of connector connection bus bars 16' extending vertically upwardly from the neighbourhood of the centre of an insulation substrate 17' of a connector module 13'. The horizontal welding tabs 20b'-1 and 20b'-2 are welded to welding tabs 16e' projecting horizontally from one edge of the insulation substrate 17' of the same connector module 13'.

The bus bars on the substrates 21'-1 and 21'-2 also have fuse connection tabs (also shown flat in FIG. 16 but in the final assembly standing vertically) corresponding to the connection tabs 20c of FIG. 13.

As shown in FIGS. 17 and 18, initially, the vertical welding tabs 20a'-1 and 20a'-2 are welded to the vertical welding tabs 16c' by resistance welding. Then, the horizontal welding tabs 20b'-1 and 20b'-2 are welded to the horizontal welding tabs 16e' by resistance welding.

When the vertical welding tabs are welded to each other, the small projection 20f of one welding tab cuts into the surface of the confronting welding tab.

As described above, after the vertical welding tabs are welded to each other by resistance welding, the horizontal welding tabs are welded to each other by resistance welding. Thus, a stress which would arise at the root of each of the vertical welding tabs if the horizontal tabs were welded first, is avoided. Accordingly, the vertical welding tabs can be welded to each other as far as their roots.

The arrangement of the tabs in the embodiment of FIGS. 16 to 18 achieves compactness of the assembly of the module in the box, and as described can avoid generation of stress in the welding tabs.

The welding method illustrated by FIGS. 17 and 18 is generally applicable to the welding of the tabs in all the embodiments illustrated.

The junction box of the present invention is not limited to that of the above-described embodiments. For example, each of the fuse module and the relay module may be divided into two parts, respectively. In this case, when the specification of any of the fuse and that of the relay is altered, it is possible to replace the module having the fuse or the relay which should be altered. However, if the fuse module and the relay module are divided into three or more parts, many assembling stages are required. Thus, it is preferable to divide the fuse module and the relay module into at most two parts, respectively, in the case of a large junction box.

The connector connection bus bars of the base circuit, the fuse connection bus bars of the fuse module, and the relay connection bus bars of the relay module may be welded to each other in any of the following three patterns, selected according to the circuit design:

(1) A connector connection bus bar and a fuse connection bus bar are welded to each other.

(2) A connector connection bus bar and a relay connection bus bar are welded to each other.

(3) A connector connection bus bar is welded to a fuse connection bus bar and to a relay connection bus bar In case (3), the fuse connection bus bar may be welded to a welding portion of the connector connection bus bar at one end thereof, the relay connection bus bar may be welded to the welding portion of the connector connection bus bar at the other end thereof; and a tab provided at third portion of the connector connection bus bar is connected to a connector.

In the first embodiment, the base circuit and the electronic control unit are accommodated in the lower and upper case parts. Additionally, it is possible to add a circuit consisting of electrical wires connected to pressure contact terminals on the base circuit. The wires may also connect to connectors which fit in the connector receiving portion. It is also possible to add a circuit formed as an electrically conductive portion of an FPC (flexible printed circuit), a PCB (printed circuit board) or a highly electrically conductive resin molded with insulating resin.

As is apparent from the foregoing description, in the junction box of the present invention, the connector connection bus bars are separately provided from the fuse connection bus bars and the relay connection bus bars, using discrete substrates. Thus, tabs for connecting the connector connection bus bars, the fuse connection bus bars, and the relay connection bus bars to connectors, fuses and relays, respectively are disposed at different positions and do not overlap each other. Accordingly, it is unnecessary to increase the number of layers of the bus bars to provide them with the tabs. Consequently, it is possible to form a thin junction box or otherwise to achieve a compact and logical lay out. For example, in the case of the construction of the first embodiment, the number of the bus bars can be reduced from six layers required in the conventional junction box to four layers. Thus, it is possible to reduce the thickness of the junction box.

Further, as described above, because the fuse connection tabs and the relay connection tabs are separate from the bus bars of the base circuit, it is easy to handle and arrange the bus bars of the base circuit. Thus, it is possible to reduce the area of the bus bars and hence the area of the junction box. Consequently, in the case where the bus bars are divided and the ends of the bus bars are welded to each other, the area of the entire bus bars is not large and hence the area of the junction box is not increased.

Further, if the specification of the fuses and the relays is altered, the fuse module, the relay module or the composite module of the fuse module and the relay module is replaced. Thus, it is unnecessary to alter the entire upper and lower cases including the base circuit. That is, the construction can permit the alteration of the specification quickly and at low cost.

What is claimed is:

1. An electrical junction box adapted to provide electrical connection to a plurality of electrical connectors, a plurality of fuses and a plurality of relays, the electrical junction box comprising:

(i) upper and lower case parts joined together to provide a casing;

(ii) a base circuit having a plurality of first bus bars and insulation layers stacked together with said insulation layers interposed between said first bus bars in a stacking direction, the base circuit being mounted in said casing and said first bus bars being arranged to provide electrical connection to electrical connectors in use;

(iii) a fuse circuit having a fuse circuit substrate, which is discrete from said base circuit, and a plurality of second bus bars fixed on said fuse circuit substrate, said fuse circuit being mounted in said casing and said second bus bars being arranged to provide electrical connection to fuses in use; and (iv) a relay circuit having a relay circuit substrate, which is discrete from said base circuit, and a plurality of third bus bars fixed on said relay circuit substrate, said relay circuit being mounted in said casing and said third bus bars being arranged to provide electrical connection to relays in use;

(v) wherein said second bus bars and said third bus bars are joined to said first bus bars.

2. An electrical junction box according to claim 1, wherein said upper and lower case parts are respectively molded synthetic resin members, at least one of said upper and lower case parts comprising connector sockets for receiving electrical connectors in use, at least one of said upper and lower case parts comprising fuse sockets for receiving fuses in use and at least one of said upper and lower case parts comprising relay sockets for receiving relays in use.

3. An electrical junction box according to claim 1, wherein said casing comprises connector sockets for receiving electrical connectors in use and said first bus bars have portions extending into said connector sockets for connection in use to electrical connectors.

4. An electrical junction box according to claim 1, wherein said casing comprises connector sockets for receiving electrical connectors in use and said first bus bars have upstanding connection portions, relaying terminals being provided which are connected to said upstanding connection portions and extend into said connector sockets for connection to electrical connectors in use.

5. An electrical junction box according to claim 1, wherein respective end portions of said second and third bus bars are joined to respective end portions of said first bus bars by one of ultrasonic welding, resistance welding, laser welding and gas welding.

6. An electrical junction box according to claim 1, wherein said second and third bus bars have first ends extending upwardly from said fuse circuit substrate and said relay circuit substrate respectively and having pressure contact grooves at their ends, and second ends extending horizontally and/or vertically and welded to said first bus bars.

7. An electrical junction box according to claim 1, wherein said fuse circuit substrate and said relay circuit substrate are discrete from each other, whereby said fuse circuit and said relay circuit constitute separate modules in said junction box.

8. An electrical junction box according to claim 7, wherein said upper and lower case parts are respectively molded synthetic resin members, at least one of said upper and lower case parts comprising connector sockets for receiving electrical connectors in use, said fuse circuit substrate and said relay circuit substrate carry respective molded synthetic resin members which respectively comprise fuse sockets and relay sockets for receiving respectively fuses and relays in use, said fuse sockets and said relay sockets being exposed through at least one opening of said casing.

9. An electrical junction box according to claim 1, wherein said fuse circuit substrate and said relay circuit substrate are combined as a unitary common substrate carrying said second bus bar and said third bus bars, whereby said fuse circuit and said relay circuit constitute a combined module in said junction box.

10. An electrical junction box according to claim 9, wherein said upper and lower case parts are respectively molded synthetic resin members, at least one of said upper and lower case parts comprising connector sockets for receiving electrical connectors in use, and said unitary common substrate carries a molded synthetic resin member which comprises fuse sockets and relay sockets for receiving fuses and relays in use, said fuse sockets and relay sockets being exposed through at least one opening of said casing.

11. An electrical junction box according to claim 1, wherein:

at least one of said fuse and relay circuits is arranged on a main face of said base circuit, and welding tabs constituted by end portions of said bus bars of said one of said fuse and relay circuits project in arrays on two opposite sides of the substrate thereof, said welding tabs at one of said two opposite sides extending horizontally from the substrate thereof and being welded to welding tabs of said first bus bars extending horizontally from said stacked insulation layers, said welding tabs at the other of said two opposite sides project as an L-shape and are welded to welding tabs of said first bus bars extending vertically from said stacked insulation layers, whereby said welding tabs at said two opposite sides of said substrate of said one of said fuse and relay circuits extend in respective directions orthogonally to each other at their welded zones.

12. An electrical junction box according to claim 11, wherein each welded-together pair of said welding tabs of said one of said fuse and relay circuits and said welding tabs of said first bus bars have mutually opposed welding surfaces on one of which there is a projection projecting towards the other thereof.

13. An electrical junction box according to claim 1, further comprising an electronic control unit mounted in said casing.

14. An electrical junction box according to claim 13, wherein welded joints of said first bus bars to said second bus bars and/or said third bus bars are located in a space beneath said electronic control unit.

* * * * *